(12) United States Patent
Humphreys et al.

(10) Patent No.: US 7,274,229 B1
(45) Date of Patent: Sep. 25, 2007

(54) COARSE TUNING FOR FRACTIONAL-N SYNTHESIZERS

(75) Inventors: Scott Humphreys, Greensboro, NC (US); Ryan Bunch, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 11/472,889

(22) Filed: Jun. 22, 2006

Related U.S. Application Data

(63) Continuation of application No. 10/901,669, filed on Jul. 29, 2004, now Pat. No. 7,064,591.

(60) Provisional application No. 60/569,900, filed on May 11, 2004.

(51) Int. Cl.
*H03L 7/06* (2006.01)
(52) U.S. Cl. .................. 327/156; 327/160; 331/16; 331/1 A
(58) Field of Classification Search .................. None
See application file for complete search history.

(56) References Cited

U.S. PATENT DOCUMENTS

| | | | |
|---|---|---|---|
| 3,538,450 A | 11/1970 | Andrea et al. | |
| 4,875,046 A | 10/1989 | Lewyn | |
| 4,918,403 A | 4/1990 | Martin | |
| 5,117,206 A | 5/1992 | Imamura | |
| 5,235,335 A | 8/1993 | Hester et al. | |
| 5,337,024 A | 8/1994 | Collins | |
| 5,493,715 A | 2/1996 | Humphreys et al. | |
| 5,635,875 A | 6/1997 | Kusakabe | |
| 5,973,633 A | 10/1999 | Hester | |
| 5,977,836 A | 11/1999 | Swan et al. | |
| 6,137,372 A | 10/2000 | Welland | |
| 6,226,449 B1 | 5/2001 | Inoue et al. | |
| 6,236,278 B1 * | 5/2001 | Olgaard | 331/25 |
| 6,509,800 B2 | 1/2003 | Stockton | |
| 6,560,452 B1 | 5/2003 | Shealy | |
| 6,693,468 B2 | 2/2004 | Humphreys et al. | |
| 6,708,026 B1 * | 3/2004 | Klemmer et al. | 455/314 |
| 6,710,664 B2 | 3/2004 | Humphreys et al. | |

(Continued)

FOREIGN PATENT DOCUMENTS

JP 6-77820 3/1994

OTHER PUBLICATIONS

Abele et al., "20mW SiGe-MMIC-VCO at 5GHz with Integrated 4:1 Divider for User in a PLL," Dept. of Electron Devices and Circuits, University of Ulm, Germany, 2001.

(Continued)

*Primary Examiner*—Kenneth B. Wells
*Assistant Examiner*—An T. Luu
(74) *Attorney, Agent, or Firm*—Withrow & Terranova, PLLC

(57) ABSTRACT

An improved coarse tuning process for fractional-N frequency synthesizers is provided. In general, a coarse tuning circuit controls a phase lock loop (PLL) of a frequency synthesizer such that the phase lock loop operates in an integer division mode during coarse tuning, thereby eliminating jitter due to fractional-N operation during coarse tuning. The coarse tuning circuit includes divide value generation circuitry that provides an integer divide value to an N divider of the PLL during coarse tuning and a fractional-N sequence to the N divider during fractional-N operation.

9 Claims, 6 Drawing Sheets

U.S. PATENT DOCUMENTS

| | | |
|---|---|---|
| 6,724,265 B2 | 4/2004 | Humphreys |
| 6,731,145 B1 | 5/2004 | Humphreys et al. |
| 6,778,022 B1 | 8/2004 | Zhang et al. |
| 6,806,786 B1 | 10/2004 | Lam et al. |
| 6,838,951 B1 | 1/2005 | Nieri et al. |
| 6,850,749 B2 | 2/2005 | Soorapanth et al. |
| 6,937,668 B2 | 8/2005 | Sridharan et al. |
| 2005/0036580 A1 | 2/2005 | Rana |

OTHER PUBLICATIONS

Dunning et al., "An All-Digital Phase-Locked Loop with 50-Cycle Lock Time Suitable for High-Performance Microprocessors," IEEE Journal of Solid-State Circuits, vol. 30, No. 4, Apr. 1995, pp. 412-422.

Koo et al., "A Fully Integrated CMOS Frequency Synthesizer With Charge-Averaging Charge Pump and Dual-Path Loop Filter for PCS- and Cellular-CDMA Wireless Systems," IEEE Journal of Solid-State Circuits, vol. 37, No. 5, May 2002, pp. 536-542.

Koo et al., "A Fully-Integrated CMOS Frequency Synthesizer with Charge-Averaging Charge Pump and Dual-Path Loop Filter for PCS- and Cellular-CDMA Wireless Systems," 2001 Symposium on VLSI Circuits Digest of Technical Papers, 2001, pp. 43-46.

Kral et al., "RF-CMOS Oscillators with Switched Tuning," Proceedings of the Custom IC Conference, Santa Clara, CA, May 1998, pp. 555-558.

Wilson et al., "A CMOS Self-Calibrating Frequency Synthesizer," IEEE Journal of Solid-State Circuits, vol. 35, No. 10, Oct. 2000, pp. 1437-1444.

* cited by examiner

COARSE TUNING FOR FRACTIONAL-N SYNTHESIZERS

CROSS-REFERENCE TO RELATED APPLICATIONS

This application is a Continuation of patent application Ser. No. 10/901,669, filed Jul. 29, 2004, now U.S. Pat. No. 7,064,591, which claims the benefit of Provisional Patent Application Ser. No. 60/569,900, filed May 11, 2004, the disclosure of which is hereby incorporated by reference in its entirety.

This U.S. patent application is related to the following concurrently filed U.S. patent application: U.S. patent application Ser. No. 10/901,546, COARSE TUNING FOR FRACTIONAL-N SYNTHESIZERS HAVING REDUCED PERIOD COMPARISON ERROR by Humphreys et al., now U.S. Pat. No. 7,023,282, which is hereby incorporated by reference in its entirety.

FIELD OF THE INVENTION

The present invention relates to a fractional-N frequency synthesizer, and more particularly to improved coarse tuning for a fractional-N frequency synthesizer.

BACKGROUND OF THE INVENTION

Frequency synthesizers are used in many systems, including microprocessors and radio frequency (RF) communication systems. Frequency synthesizers of the phase locked loop (PLL) type contain controlled oscillators (CO) that are typically current controlled oscillators (ICO) or voltage controlled oscillators (VCO). The output of the CO is often used as an injection signal for an RF mixer or in a microprocessor clock system. The frequency synthesizer controls the CO such that its frequency or period is approximately equal to that of a stable frequency reference multiplied by a predetermined ratio. In many applications, there is a need to compensate for process and environmental variations that affect synthesizer performance. The prior art contains many systems, known as coarse tuning systems, that compensate for variations in the CO's frequency tuning range or center frequency by performing a coarse tuning of the tunable elements in the CO. These systems have been developed for integer-N synthesizers where the divided CO signal used for feedback to the phase detector has a steady period when the CO's output frequency is not changing.

The use of fractional-N synthesizers provides reduced lock times for the synthesizer's phase lock loop (PLL) and improves noise performance, but introduces significant jitter on the divided CO signal. Even with a constant CO output frequency, the divider modulus, and therefore the period of the divided CO signal, is varied from one output clock cycle to the next to provide a desired average fractional modulus over a period of time. The resulting jitter on the divided CO signal significantly reduces the accuracy of existing techniques for calibrating and tuning the CO. Accordingly, there is a need for a technique to reduce the impact of jitter on the divided CO signal and provide accurate calibration or coarse tuning of a CO in a fractional-N synthesizer in a cost-effective and efficient manner.

SUMMARY OF THE INVENTION

The present invention provides an improved coarse tuning process for fractional-N frequency synthesizers. In general, a coarse tuning circuit controls a phase lock loop (PLL) of a frequency synthesizer such that the PLL operates in an integer division mode during coarse tuning and switches to a fractional-N division mode during normal operation, thereby eliminating jitter during coarse tuning. The coarse tuning circuit includes divide value generation circuitry that provides a fractional-N sequence to an N divider during fractional-N operation and an integer divide value to the N divider of the PLL during coarse tuning.

During coarse tuning, a reference signal used to control an output frequency of the PLL is provided to the coarse tuning circuitry from the PLL and is divided by a factor M to provide a divided reference signal. A controllable oscillator (CO) output signal from a CO in the PLL is divided by the N divider to provide a divided CO signal. The divide value generation circuitry controls the N divider such that the CO output signal is divided by a factor N*M, where N is an integer component of the desired divide value for the fractional-N synthesizer. The periods or, equivalently, frequencies of the divided CO signal and the divided reference signal are compared, and the result is used to select an appropriate tuning curve for the CO.

In one embodiment, synchronization circuitry operates to synchronize the N divider of the PLL and an M divider of the coarse tuning circuit. The synchronization circuitry is clocked by a clock signal having a frequency significantly greater than the frequency of the reference signal, thereby reducing error associated with the comparison of the frequency of the divided reference signal and a frequency of the divided CO signal.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
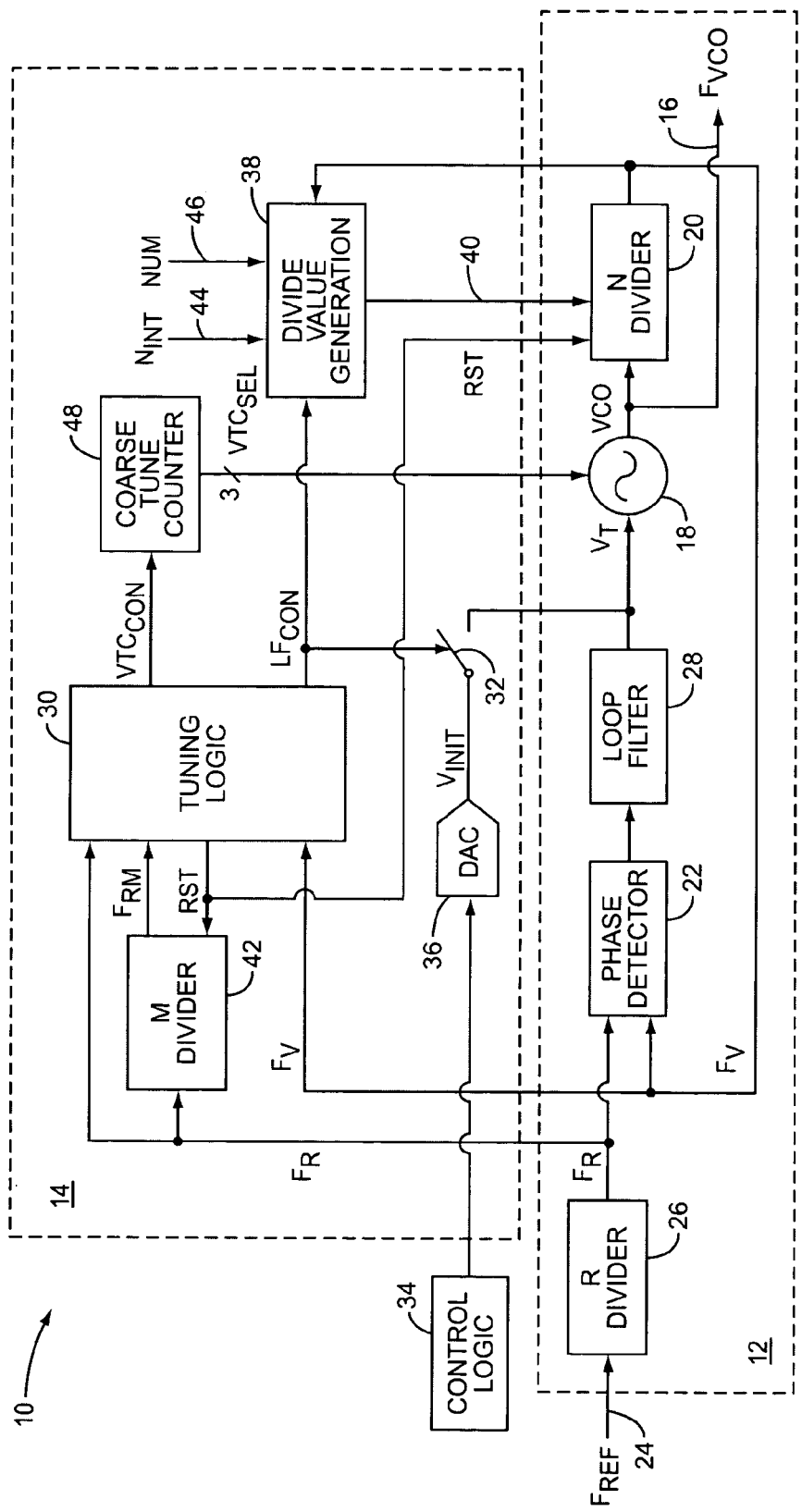
FIG. 1 illustrates a fractional-N frequency synthesizer according to one embodiment of the present invention.

FIG. 1 illustrates a fractional-N frequency synthesizer 10 according to the present invention. During coarse tuning, the frequency synthesizer 10 operates in an integer divide mode, thereby eliminating all frequency error due to jitter. Once coarse tuning is performed, the frequency synthesizer switches to normal operation in a fractional-N division mode and locks to the desired frequency.

With reference to FIG. 1, the fractional-N frequency synthesizer 10 includes a fractional-N phase lock loop (PLL) 12 and coarse tuning circuitry 14. The PLL 12 generates a desired frequency for the output signal, $F_{VCO}$, 16, of a voltage controlled oscillator (VCO) 18. In traditional fashion, the output signal $F_{VCO}$ 16 is also provided to divider circuitry 20 to divide the output signal $F_{VCO}$ by a factor N to produce a divided VCO signal $F_V$, which is fed to one of two inputs of a phase detector 22.

A reference frequency, $F_{REF}$, 24, is divided by a factor R by divider circuitry 26 to produce a reference signal, $F_R$, which is provided to the other input of the phase detector 22. The N and R factors of the N divider 20 and the divider circuitry 26, respectively, are selected so that the frequencies of the reference signal, $F_R$, and the divided VCO signal, $F_V$ are equal when the desired output signal, $F_{VCO}$, 16, is at a desired frequency. The phase detector 22 compares the relative phases of the reference signal, $F_R$, and the divided VCO signal, $F_V$, and provides an output relative to the difference in phase to control the VCO 18. The output of the phase detector 22 is preferably provided by a charge pump and filtered by a loop filter 28 to provide a stable voltage for a VCO fine tuning signal, $V_T$, to adjust the desired output frequency $F_{VCO}$ of the VCO 18 based on the difference in phase of the reference signal, $F_R$, and the divided VCO signal, $F_V$.

The coarse tuning circuitry 14 of the present invention effectively calibrates the fine tuning frequency range of the VCO 18 by selecting the appropriate tuning curve. During coarse tuning, the VCO fine tuning signal $V_T$ is forced to a desired initialization value (voltage or current) under the control of tuning logic 30. Using a switch 32, the initialization value, $V_{INIT}$, is coupled to the output of the loop filter 28 to force the VCO fine tuning signal $V_T$ to the initialization value, $V_{INIT}$. Optionally, the initialization value, $V_{INIT}$, may be coupled to the input of the loop filter 28. The switch 32 may take many forms, including a transistor biased to provide a switching function. The initialization value, $V_{INIT}$, may be provided using a variety of techniques. In one embodiment, control logic 34 provides a digital value to a digital-to-analog converter (DAC) 36, which provides a corresponding analog voltage for the initialization value, $V_{INIT}$. The tuning logic 30 will typically provide a loop filter control signal, $LF_{CON}$, to cause switch 32 to apply the initialization voltage, $V_{INIT}$, to the output of the loop filter 28.

During coarse tuning, the tuning logic 30 also switches divide value generation circuitry 38 into an integer mode. In this embodiment, the divide value generation circuitry 38 is switched to the integer mode by the assertion of the loop filter control signal, $LF_{CON}$. According to the present invention, when the loop filter control signal, $LF_{CON}$, is asserted, the divide value generation circuitry 38 generates a divide value 40 that is an integer equal to the integer component of the desired N value multiplied by the modulus M of M divider circuit 42. The desired N value is defined by the combination of an integer value, $N_{INT}$, 44, and a fractional component. Typically, a number, NUM 46, represents a numerator of the fractional component. Accordingly, during coarse tuning, the divided VCO output signal is the VCO output signal $F_{VCO}$ divided by N*M.

The M divider circuit 42 divides the reference signal, $F_R$, by a factor of M to create a divided reference signal, $F_{RM}$. In one embodiment, the divider circuit 42 provides a modulus of 64 (M=64). Further, the modulus M of the divider circuit 42 is preferably a power of two such as but not limited to 2, 8, 16, 32, 64, 128 . . . , as is discussed in more detail below. The tuning logic 30 processes the divided reference signal $F_{RM}$ and the divided VCO signal, $F_V$, to provide a VCO control signal $VTC_{CON}$, which controls calibration of the VCO 18. In the preferred embodiment, the tuning logic 30 is a state machine configured to compare the periods of the divided VCO signal $F_V$ and divided reference signal $F_{RM}$ and provide a pulse for the control signal $VTC_{CON}$ to control a coarse tune counter 48. The output of the coarse tune counter 48 provides select signal $VTC_{SEL}$ to select a capacitance value of the VCO's resonant circuit. Alternatively, the tuning logic 30 may generate the VCO select signal $VTC_{SEL}$ directly, for example, as the output of a state machine that implements a binary search. Based on the comparison of the divided VCO signal $F_V$ and the divided reference signal $F_{RM}$, the tuning logic 30 calibrates the VCO 18.

Once coarse tuning is complete, the loop filter control signal, $LF_{CON}$, is deasserted such that the divide value generation circuitry 38 is switched to fractional-N mode and the frequency synthesizer 10 operates as a fractional-N frequency synthesizer.

Figure 2A:
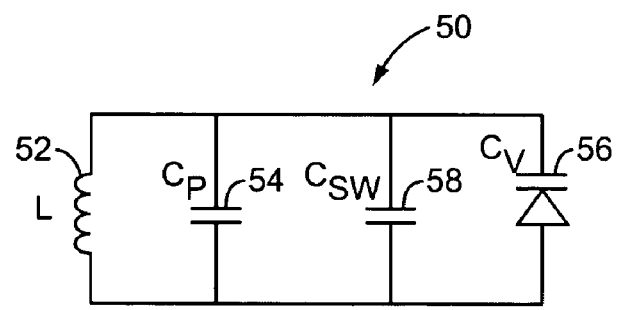
FIG. 2A illustrates a resonant tank of the voltage controlled oscillator of the fractional-N synthesizer of FIG. 1 according to one embodiment of the present invention.

With reference to FIG. 2A, one embodiment of the VCO 18 has a tank circuit 50 including parallel inductance 52 (L), fixed or parasitic capacitance 54 ($C_P$), variable capacitance 56 ($C_V$), and switched capacitance 58 ($C_{SW}$). The resonant frequency of the tank circuit is defined by:

$$f = \frac{1}{2\pi\sqrt{L(C_p + C_{sw} + C_v)}}.$$

The variable capacitance 56 may be a varactor or other continuously variable capacitance. The variable capacitance 56 is typically used for fine tuning under the control of the fine tuning signal $V_T$ provided by the PLL 12.

Figure 2B:
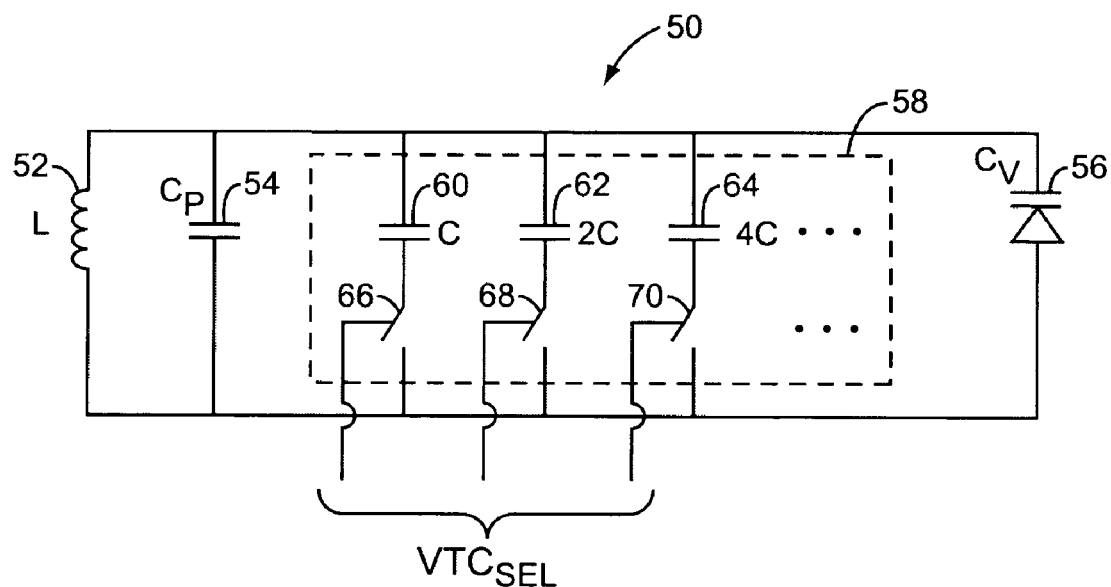
FIG. 2B is a more detailed illustration of the resonant tank of FIG. 2A.

As shown in FIG. 2B, one embodiment of the switched capacitance 58 is a network of capacitors 60, 62, 64, which can be selectively switched into or out of the VCO tank circuit 50 via switches 66, 68, 70, respectively, for coarse tuning. The switches 66, 68, 70 can take many forms, including transistors biased to operate as switches. The capacitors 60, 62, 64 are preferably binary weighted and switched into the VCO tank circuit 50 under the control of the VCO tank capacitance select signal $VTC_{SEL}$ from the coarse tune counter 48. In one embodiment, the VCO tank capacitance select signal $VTC_{SEL}$ is a three bit digital signal, where the bits correspond to the respective capacitance values C, 2C, 4C for the capacitors 60, 62, 64, respectively. Accordingly, VTC signal values 000 (binary) through 111 will correlate to capacitance values 0 through 7 for the switched capacitance 58 of the VCO tank circuit 50. Alternatively, the capacitors may be unit weighted, for example to allow an interdigitated layout for better matching, as is well known in the art. In this case, each bit of the VTC signal is connected in parallel to the switches 66, 68, and 70 controlling the capacitors 60, 62, and 64 that comprise the corresponding capacitance for that bit. For example, the least significant bit (bit 0) of the VTC signal is coupled to the switch 66 that controls the capacitor 60 having a weight. C. Bit 1 of the VTC signal is coupled to switch 68 that controls the capacitor 62 of weight 2C. Alternatively, the capacitor 62 may be two capacitors of weight C such that the combined capacitance is 2C, and the switch 68 may be replaced by two switches each controlled by bit 1. Similarly, bit 2 of the VTC signal is coupled to the switch 70 that control the capacitor 64 having a weight 4C. This arrangement provides balanced parasitic capacitances that scale proportionally with the tuning curve selection, yielding evenly spaced tuning curves.

Figure 3:
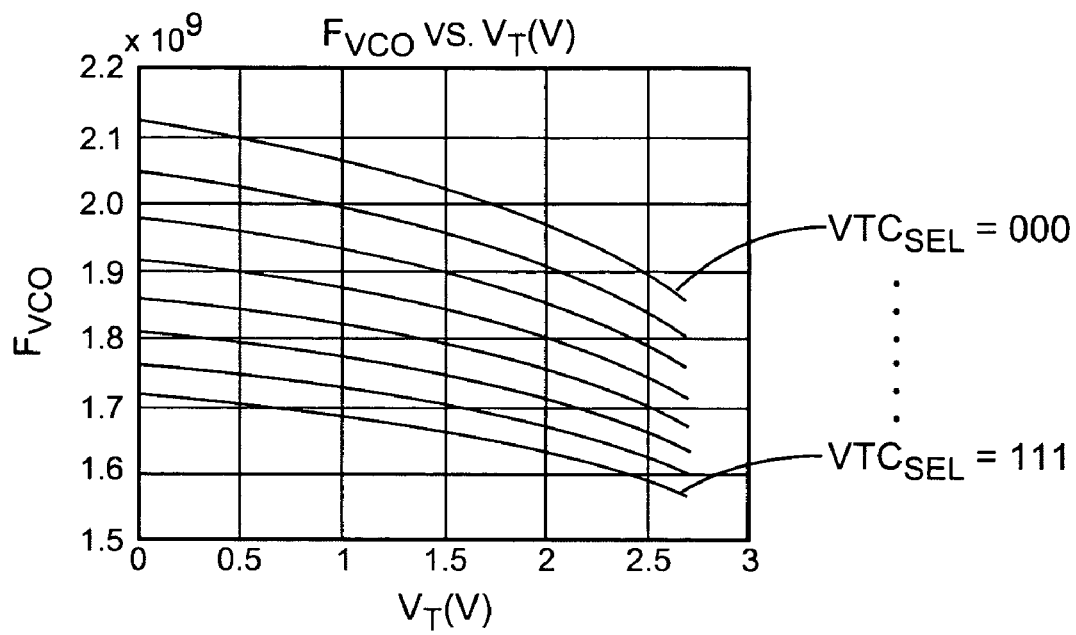
FIG. 3 illustrates VCO output versus tuning voltage according to one embodiment of the present invention.

The operating characteristics for an exemplary VCO 18 having the above-configured VCO tank circuit 50 are shown in FIG. 3. Since the switched capacitance 58 can be configured to have one of eight capacitance values, the VCO 18 will have eight tuning curves corresponding to the respective capacitance values. The bottom tuning curve corresponds to having all three capacitors 60, 62, 64 switched into the network when the select signal $VTC_{SEL}$ is 111. The top tuning curve corresponds to having all three capacitors 60, 62, 64 switched out of the network when the select signal $VTC_{SEL}$ is 000. Depending on the fine tuning signal voltage, $V_T$, there are multiple tuning curves capable of providing a selected frequency. For best noise performance and more consistent tuning gain for the VCO 18, the voltage of the fine tuning signal, $V_T$, should be kept within an acceptable range. Typically, the Q of the varactor 56 tends to fall off at higher capacitance and higher tuning voltage values. For this example, assume the preferred operating range for the VCO 18 corresponds to a fine tuning signal voltage $V_T$ between 0.4 and 1.6 volts.

Figure 4:
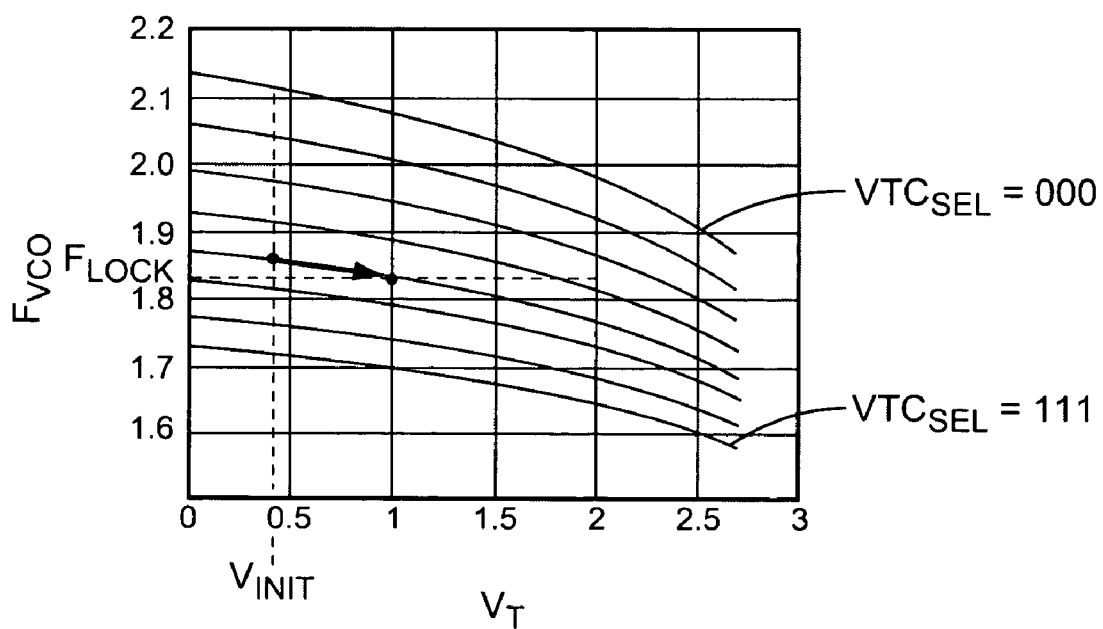
FIG. 4 is a illustrates the general process of coarse tuning according to one embodiment of the present invention.

FIG. 4 generally illustrates the operation of the coarse tuning circuitry 14 according to the present invention with respect to exemplary operating characteristics of the VCO 18. As an example, the desired tuning curve of the VCO 18 may be defined as the lowest frequency tuning curve on which the VCO signal, $F_{VCO}$, is higher than a desired lock frequency, $F_{LOCK}$. During coarse tuning, the tuning voltage, $V_T$, of the VCO 18 is forced to the initialization value, $V_{INIT}$. Based on the comparison of the divided VCO signal, $F_V$, and the divided reference signal, $F_{RM}$, the tuning logic 30 steps through the tuning curves until the desired tuning curve is selected. Once the tuning curve is selected, the tuning logic de-asserts the loop filter control signal, $LF_{CON}$, such that the frequency synthesizer 10 fine tunes the output of the VCO 18 to the lock frequency, $F_{LOCK}$.

Figure 5:
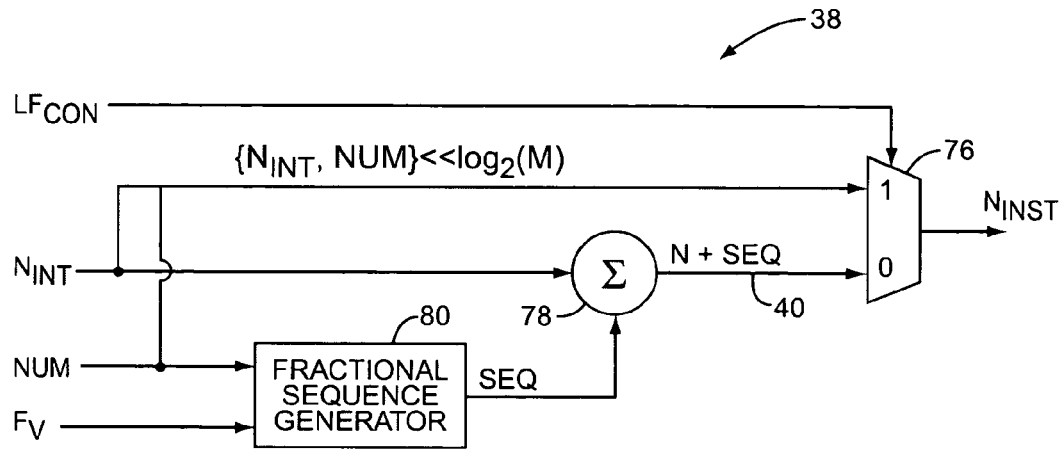
FIG. 5 illustrates the divide value generation circuitry according to one embodiment of the present invention.

FIG. 5 illustrates one embodiment of the divide value generation circuitry 38. In general, the divide value 40 from the divide value generation circuitry 38 is an output of decision circuitry 76, $N_{INST}$. In this embodiment, the decision circuitry 76 is controlled by the loop filter control signal, $LF_{CON}$. During coarse tuning, the loop filter control signal, $LF_{CON}$, is asserted and the divide value, $N_{INST}$, is an integer component of the product of a desired N value and the modulus M. During fractional-N operation, the loop filter control signal, $LF_{CON}$, is de-asserted and the divide value, $N_{INST}$, is a fractional sequence that is the sum of the integer, $N_{INT}$, and a sequence (SEQ). The sequence (SEQ) is a sequence of integer values having an average value equal to the desired fraction.

At a first input, the decision circuitry 76 receives the product of the desired N value and the modulus M of the M divider 42. The desired N value is the combination of the integer $N_{INT}$ and the numerator of the fractional component, NUM. In this embodiment, the modulus M of the divider 42 is a power of two (2, 4, 8, 16, 32, 64, . . . ). Thus, the multiplication of the modulus M and the desired N value is preferably performed by left shifting the bits of the desired N value by $\log_2(M)$ bits. However, other methods of multiplication may be used, and modulus M may be a number that is not a power of two.

At a second input, the decision circuitry 76 receives the sum of $N_{INT}$ and the sequence (SEQ) from summation circuitry 78. The sequence (SEQ) of integer values is generated by a fractional sequence generator 80 based on the number, NUM, representing a numerator of the fractional component. In one embodiment, the fractional sequence generator 80 employs a third order MASH style delta-sigma modulator.

Figure 6:
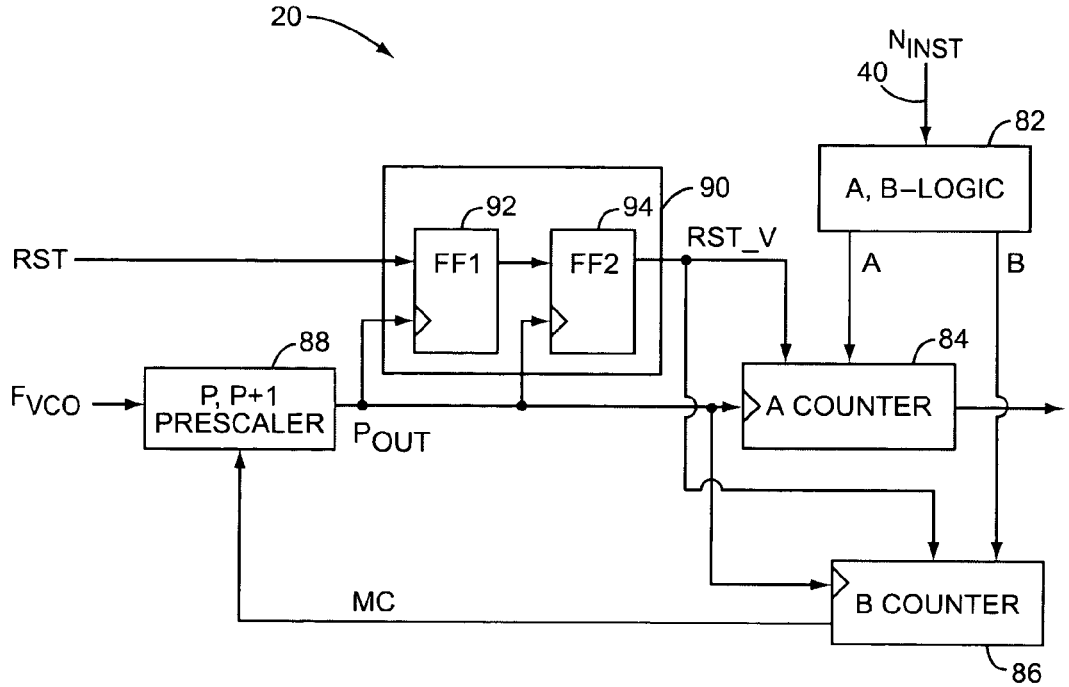
FIG. 6 illustrates the N divider circuit according to one embodiment of the present invention.

FIG. 6 illustrates one embodiment of the N divider circuit 20. In general, A, B logic 82 generates count values A and B from the divide value $N_{INST}$ from the divide value generation circuitry 38 using the equation:

$$N_{INST} = (P \times A) + B,$$

where P is the first modulus of a dual modulus prescaler 88. The prescaler 88 operates to divide the VCO output signal $F_{VCO}$ by either P or P+1 based on a modulus control signal MC from the B counter 86. The A counter 84 divides the output signal $P_{OUT}$ from the prescaler 88 by the A count value, thereby providing the divided VCO signal $F_V$.

The N divider circuit 20 also includes a synchronizer 90 including first and second flip flops 92 and 94. The synchronizer 90 operates to re-time the reset signal RST from the reference signal $F_R$ domain to the prescaler output signal $P_{OUT}$ domain. The benefit of the synchronizer 90 is illustrated in FIG. 7.

Figure 7:
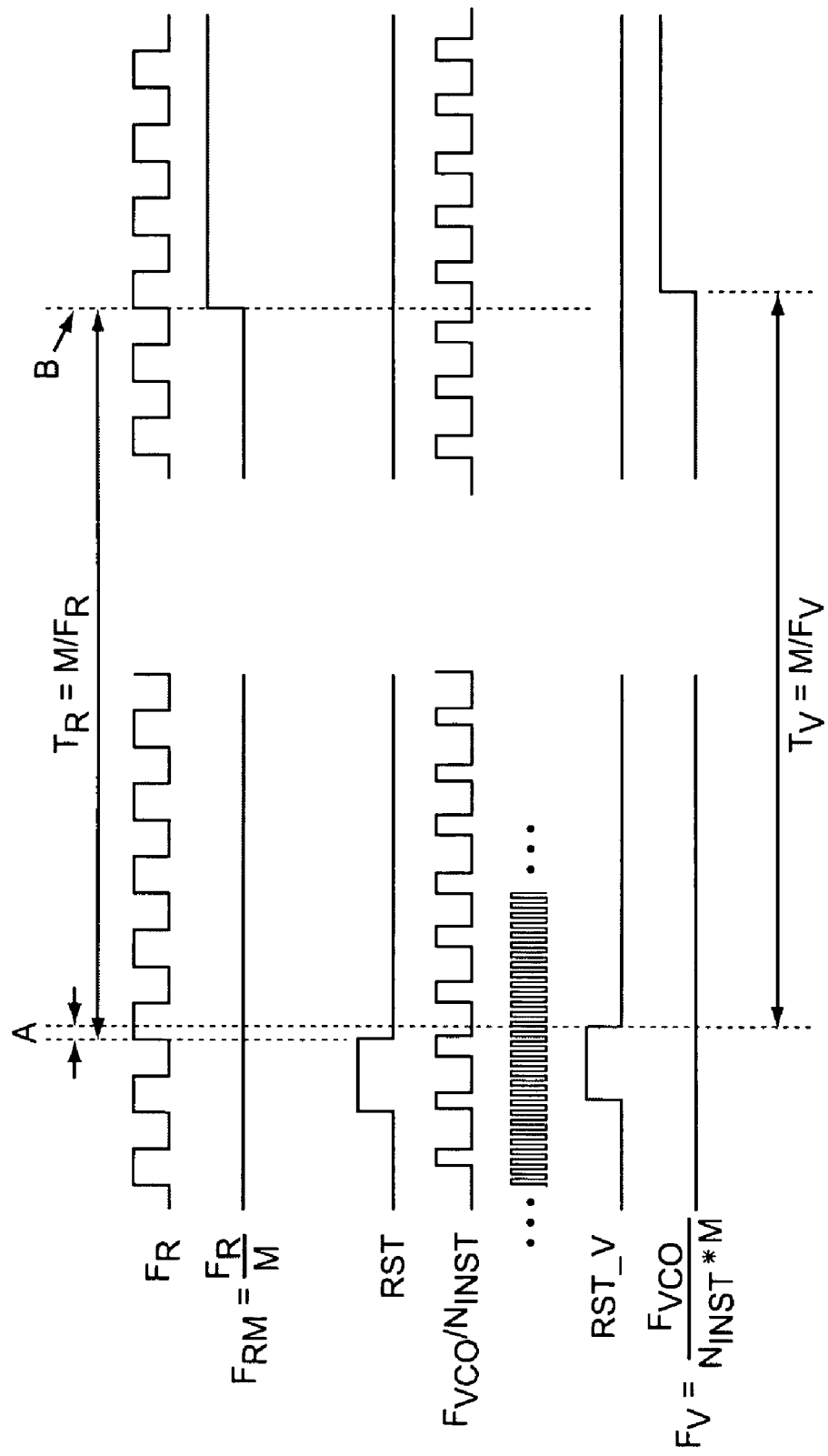
FIG. 7 illustrates a timing diagram of the frequency synthesizer according to one embodiment of the present invention.

FIG. 7 illustrates a timing diagram for the frequency synthesizer 10 of the present invention during coarse tuning. After M cycles of the $F_R$ signal and $N_{INST}*M$ cycles of the VCO signal, $F_{VCO}$, the signals $F_{RM}$ and $F_V$ are asserted. The time period A is the time between when the M divider 42 and the N divider 20 may start. This period is a significant source of error in the comparison of the period of the divided reference signal $F_{RM}$ and the period of the divided VCO signal $F_V$ during coarse tuning. By clocking the synchronizer 90 using the prescaler output $P_{OUT}$, the period A is minimized and the period comparison error is reduced. In another embodiment, the flip flops 92 and 94 of the synchronizer 90 are capable of being clocked by the VCO output signal $F_{VCO}$, and the synchronizer is clocked by the VCO output signal $F_{VCO}$, thereby further reducing the time period A and minimizing the period comparison error. By minimizing the period comparison error, the overall frequency error of the frequency synthesizer 10 is also reduced.

Figure 8:
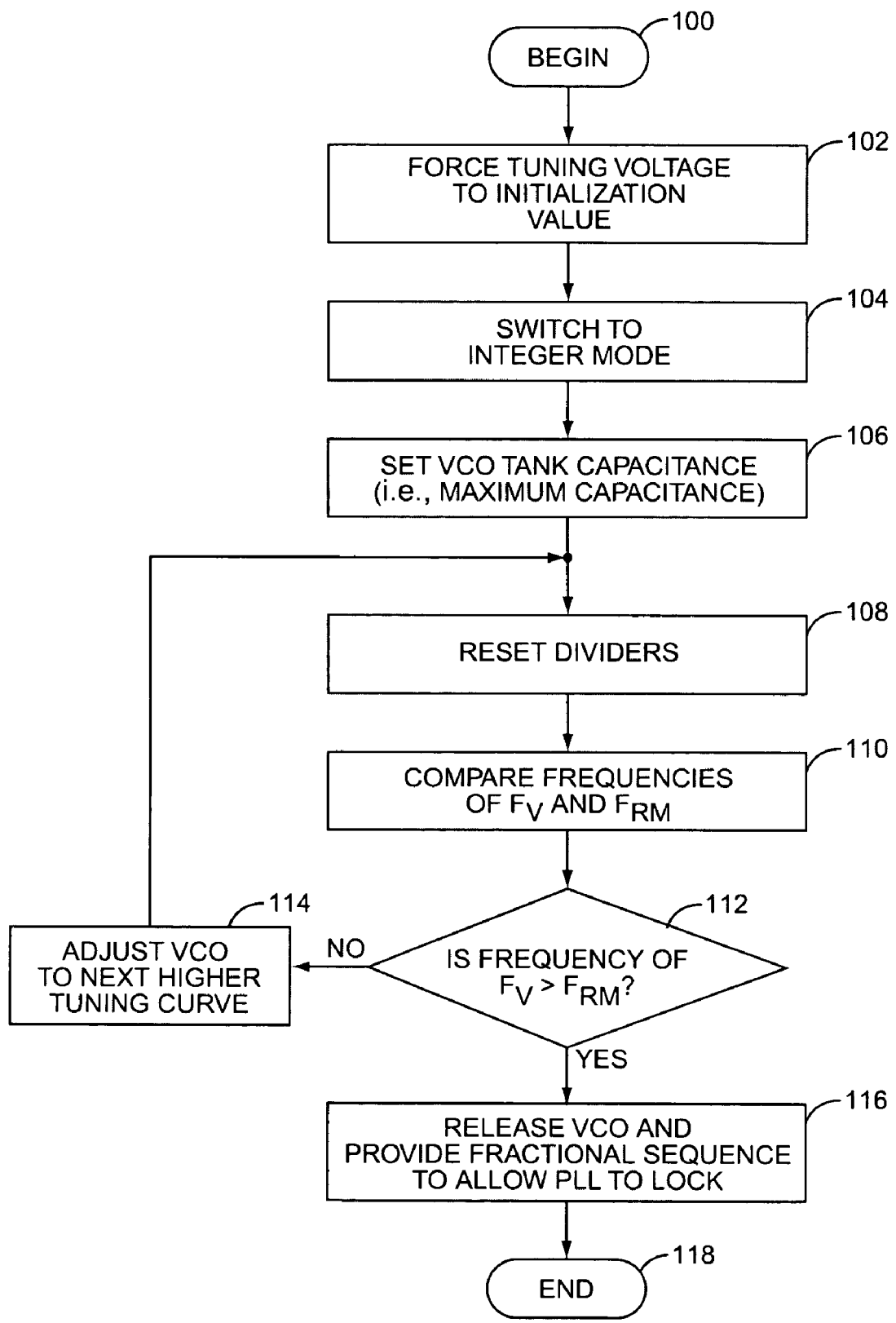
FIG. 8 illustrates a method of coarse tuning a fractional-N frequency synthesizer according to one embodiment of the present invention.

In operation, a coarse tuning process is carried out each time the PLL 12 is enabled. The tuning process selects an appropriate capacitance setting for the switched capacitance 58 within a period of time sufficiently short that it does not significantly impact the required warm-up time for the PLL 12. In general, the process operates by dividing the VCO output signal $F_{VCO}$ by the integer component of the product of the desired N value and the modulus M of the M divider 42. The periods of the divided VCO signal $F_V$ and the divided reference signal $F_{RM}$ are compared and an appropriate capacitance is selected for the switched capacitance 58 to select the tuning curve of the VCO's output signal $F_{VCO}$ 16. In one embodiment, the process repeats for each tuning curve by progressively incrementing or decrementing different capacitance 58 values until an acceptable tuning curve is selected. A binary search algorithm may be implemented to reduce the number of comparison steps, at the expense of increased complexity in the tuning logic 30. Further details for the tuning process according to one embodiment of the present invention are provided in association with the flow diagram of FIG. 8.

The coarse tuning process begins (step 100) by forcing the tuning voltage of the VCO fine tuning signal $V_T$ to the initialization voltage $V_{INIT}$ (step 102). For the illustrated example, the VCO fine tuning signal $V_T$ is forced to 0.4 volts. Assume the control logic 34 sends a digital value to the DAC 36 to set the initialization voltage, $V_{INIT}$, to 0.4 volts. The tuning logic 30 will then activate the loop filter control signal $LF_{CON}$ to close switch 32 and apply the initialization voltage, $V_{INIT}$, to the input of the VCO 18. Alternatively, the initialization voltage $V_{INIT}$ may be applied to the loop filter 28, which is typically a low pass filter, thereby forcing the VCO fine tuning signal $V_T$ to 0.4 volts.

The divide value generation circuitry 38 is switched into integer mode (step 104). In integer mode, the divide value of the N divider circuit 20 is set to the integer component of the product of the desired N value and the modulus M of the M divider 42. As discussed above, the desired N value is determined based on the combination of the integer $N_{INT}$ and the numerator NUM of the fractional component.

Next, the capacitance of the tank circuit 50 for the VCO 18 is set to a tuning curve corresponding to a minimum frequency range (step 106). Accordingly, the coarse tune counter 48 generates a select signal $VTC_{SEL}$ to switch each of the capacitors 60, 62, 64 into the switched capacitance 58 to set the VCO 18 to operate at the minimum frequency range. In this example, the select signal $VTC_{SEL}$ is initialized to 111. In alternative embodiments, the VCO 18 may be initialized for the maximum frequency range.

The tuning logic 30 then resets the dividers 20 and 42 by asserting the reset signal RST (step 108), and compares the frequencies, or periods, of the divided reference signal $F_{RM}$ and the divided VCO signal $F_V$ (step 110).

In the preferred embodiment, the divider 42 receives the reference signal $F_R$ and provides an output pulse every M cycles to generate the divided reference signal $F_{RM}$. Similarly, the divider 20 receives the VCO signal $F_{VCO}$ and provides an output pulse every N*M cycles to generate the divided VCO signal $F_V$. The tuning logic 30 receives both the divided reference signal $F_{RM}$ and the divided VCO signal $F_V$. Preferably, the tuning logic 30 resets each of the divider circuits 20 and 42 with the RST signal (step 108), and then senses whether the first output pulse of the divided VCO signal $F_V$ occurs before the first output pulse of the divided reference signal $F_{RM}$, indicating that the frequency of the divided VCO signal $F_V$ is higher than that of the divided reference signal $F_{RM}$. Because the frequency of the divided reference signal $F_{RM}$ and the frequency of divided VCO signal $F_V$ are simply equal to the frequency of the reference signal $F_R$ divided by M and frequency of the VCO signal $F_{VCO}$ divided by N*M, respectively, this comparison also indicates whether the frequency of the VCO is higher than the desired operating frequency.

In the preferred embodiment, the desired tuning curve is the lowest frequency tuning curve on which the frequency of the output signal $F_{VCO}$ at initialization voltage $V_{INIT}$, is higher than that desired. By comparing the respective periods, if the frequency of the divided VCO signal $F_V$ is determined to be less than that of the divided reference $F_{RM}$ signal (i.e. the period for $F_V$ is greater than $F_{RM}$) (step 112), the tuning logic 30 preferably provides a control signal $VTC_{CON}$ to decrement the coarse tune counter 48. Decrementing the coarse tune counter 48 results in a VCO select signal $VTC_{SEL}$ decrementing the capacitance value of the switched capacitance 58 to select the next higher tuning curve, which corresponds to the next higher frequency range (step 114).

The periods for the divided VCO signal $F_V$ and the divided reference signal $F_{RM}$ are again compared, and the switched capacitance 58 is decremented until the frequency of the divided VCO signal $F_V$ is greater than the frequency of the divided reference signal $F_{RM}$ (step 112). Once the frequency of the divided VCO signal $F_V$ is greater than the frequency of the divided reference signal $F_{RM}$, the tuning logic 30 releases the initialization voltage $V_{INIT}$ from the input of the VCO 18 and controls the divide value generation circuitry 38 such that it provides the fractional sequence ($N_{INT}$+SEQ) by deactivating the $LF_{CON}$ signal, thereby switching to fractional-N mode and allowing the PLL 12 to lock (step 116) and the process ends (step 118). The tuning logic 30 will maintain the switched capacitance 58 at the appropriate capacitance via the VCO select signal $VTC_{SEL}$ to ensure that the VCO 18 operates at the appropriate tuning curve.

Alternatively, the VCO 18 may be initialized at the maximum frequency tuning curve wherein the select signal $VTC_{SEL}$ is 000. During coarse tuning, the VCO fine tuning signal $V_T$ is forced to 1.6 volts, the divider value 30 is forced to the integer component of the desired N value and the modulus M of the M divider 42, and the switched capacitance 58 is incremented until the frequency of the divided VCO signal $F_V$ is less than the frequency of the divided reference signal $F_{RM}$.

The maximum duration of the coarse tuning process is approximately the period of the divided reference frequency, $F_{RM}$ (M*R/$F_{REF}$), times the number of capacitance settings for the switched capacitance 58 of the VCO tank circuit 54. For a 26 MHz reference frequency $F_{REF}$, an R value of 1, an M value of 64, and eight capacitance settings, the coarse tuning operation would take at most 20 microseconds before the phase locking in the PLL 12 can begin. Accordingly, the impact of coarse tuning on locking time of the PLL 12 is minimal. Alternatively, a binary search algorithm may be employed, in which only one frequency comparison is required for each bit of the VCO control signal $VTC_{CON}$. In this example, only three comparisons would be needed instead of eight, further reducing the duration of the coarse tuning operation.

Preferably, the invention is implemented in a manner minimizing the number of interconnections between the coarse tuning circuitry 14 and the PLL 12, especially in embodiments where the two circuits are on separate packages or semiconductor die. For example, the coarse tune counter 48 and VCO 18 may be placed on a common die, and the coarse tune counter 48 will only require one input to receive the VCO control signal $VTC_{CON}$ to control the value of the switched capacitance 58 of the VCO tank circuit 50. This arrangement reduces the number of pins required on the associated semiconductor packages, or the number of bond pads on the associated die, reducing cost and area.

It will be recognized that the above discussion applies equally well to other types of oscillators that may be used with fractional-N frequency synthesizers. For example, ring oscillators can be constructed with coarse and fine tuning control signals provided by switched capacitive loads or switched transistor amplifier stages, and supply voltage or current tuning, respectively. Accordingly, elements, such as gain stages or impedance devices, may be selectively switched into or out of the current or voltage controlled oscillator circuitry to select a tuning curve. Further, the counters described herein may be implemented using registers to hold value, or state machines. As such, a counter is deemed to cover and include these configurations.

Additional detail pertaining to ring oscillators is found in, "An all-digital phase-locked loop with 50-cycle lock time suitable for high-performance microprocessors," by J. Dunning et al., IEEE Journal of Solid-State Circuits, Volume 30, Issue 4, April 1995, pages 412-422.

Those skilled in the art will recognize improvements and modifications to the preferred embodiments of the present invention. All such improvements and modifications are considered within the scope of the concepts disclosed herein and the claims that follow.

What is claimed is:

1. A fractional-N frequency synthesizer comprising:
a phase lock look (PLL);
coarse tuning circuitry coupled to the PLL and adapted to control the PLL such that the PLL operates in an integer division mode during coarse tuning and a fractional-N division mode during normal operation;
wherein the coarse tuning circuitry comprises divide value generation circuitry adapted to:
provide an integer divide value to a divider of the PLL when operating in the integer division mode; and
provide a fractional sequence of divide values to the divider of the PLL when operating in the fractional-N division mode,
wherein the integer divide value includes an integer component of a product of a desired N value and a modulus M.

2. A fractional-N frequency synthesizer comprising:
a phase lock loop (PLL);
coarse tuning circuitry coupled to the PLL and adapted to control the PLL such that the PLL operates in an integer division mode during coarse tuning and a fractional-N division mode during normal operation;
wherein the coarse tuning circuitry comprises divide value generation circuitry adapted to:
provide an integer divide value to a divider of the PLL when operating in the integer division mode; and
provide a fractional sequence of divide values to the divider of the PLL when operating in the fractional-N division mode,
wherein the fractional sequence of divide values includes a sum of an integer and a sequence of integer values having an average value equal to a desired fraction.

3. The fractional-N frequency synthesizer of claim 2 wherein the coarse tuning circuitry comprises decision circuitry, wherein the decision circuitry is adapted to select an integer divide value in order to place the PLL in integer division mode and to select a fractional sequence of divide values in order to place the PLL in fractional-N division mode.

4. The fractional-N frequency synthesizer of claim 3 wherein the decision circuitry includes a multiplexer.

5. A fractional-N frequency synthesizer comprising:
a phase lock loop (PLL);
coarse tuning circuitry coupled to the PLL and adapted to control the PLL such that the PLL operates in an integer division mode during coarse tuning and a fractional-N division mode during normal operation,
wherein the coarse tuning circuitry comprises decision circuitry wherein the decision circuitry is adapted to select an integer divide value in order to place the PLL in integer division mode and to select a fractional sequence of divide values in order to place the PLL in fractional-N division mode, and
wherein the coarse tuning circuitry is adapted to select first and second values for a loop control signal and wherein the decision circuitry is adapted to:
select the integer divide value in order to place the PLL in integer division mode in response to the loop control signal having the first value; and
select the fractional sequence of divide values in order to place the PLL in fractional-N division mode in response to the loop control signal having the second value.

6. A method for coarse tuning a fractional-N frequency synthesizer comprising:
controlling a phase lock loop (PLL) such that the PLL operates in an integer division mode during coarse tuning; and
controlling the PLL such that the PLL operates in a fractional-N division mode during normal operation,
wherein controlling the PLL such that the PLL operates in the integer division mode during coarse tuning includes controlling a decision circuit such that an integer divide value is provided to a divider of the PLL during coarse tuning and wherein controlling the PLL such that the PLL operates in the fractional-N division mode during normal operation includes controlling the decision circuit such that a fractional sequence of divide values is provided to the divider of the PLL during normal operation, and wherein the integer divide value includes an integer component of a product of a desired N value and a modulus M.

7. The method of claim 6 wherein the fractional sequence of divide values includes a sum of an integer and a sequence of integer values having an average value equal to a desired fraction.

8. A method for coarse tuning a fractional-N frequency synthesizer comprising:
controlling a phase lock loop (PLL) such that the PLL operates in an integer division mode during coarse tuning; and
controlling the PLL such that the PLL operates in a fractional-N division mode during normal operation,
selecting a first value for a loop control signal wherein controlling the decision circuit such that the decision circuit outputs the integer divide value during coarse tuning is performed in response to selecting the first value for the loop control signal; and
selecting a second value for the loop control signal wherein controlling the decision circuit such that the decision circuit outputs the integer divide value during coarse tuning is performed in response to selecting the second value for the loop control signal,
wherein controlling the PLL such that the PLL operates in the integer division mode during coarse tuning includes controlling a decision circuit such that an integer divide value is provided to a divider of the PLL during coarse tuning and wherein controlling the PLL such that the PLL operates in the fractional-N division mode during normal operation includes controlling the decision circuit such that a fractional sequence of divide values is provided to the divider of the PLL during normal operation.

9. A method for coarse tuning a fractional-N frequency synthesizer comprising:
   providing an integer divide value to a divider of a phase lock loop (PLL) during coarse tuning, thereby controlling the PLL such that the PLL operates in an integer division mode during coarse tuning; and
   providing a fractional sequence of divide values to the divider of the PLL during normal operation, thereby controlling the PLL such that the PLL operates in a fractional-N division mode during normal operation,
wherein controlling the PLL such that the PLL operates in the integer division mode during coarse tuning includes selectively coupling the integer divide value to the PLL and wherein controlling the PLL such that the PLL operates in the fractional-N division mode during normal operation includes selectively coupling the fractional sequence of divide values to the PLL, and wherein selectively coupling the integer divide value to the PLL includes multiplexing the integer divide value to the PLL in response to a first value for a loop filter control signal and wherein selectively coupling the fractional sequence of divide values to the PLL includes multiplexing the fractional sequence of divide values to the PLL in response to a second value for the loop filter control signal.

* * * * *